(12) United States Patent
Buer et al.

(10) Patent No.: US 6,272,439 B1
(45) Date of Patent: Aug. 7, 2001

(54) PROGRAMMABLE DELAY PATH CIRCUIT AND OPERATING POINT FREQUENCY DETECTION APPARATUS

(75) Inventors: Mark L. Buer, Chandler; David A. Auer, Gilbert, both of AZ (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/028,857

(22) Filed: Feb. 24, 1998

(51) Int. Cl.[7] ........................................ H03L 7/06
(52) U.S. Cl. .......................... 702/75; 702/79; 327/158
(58) Field of Search .................... 702/66, 69–76, 702/78, 79, 89, 106, 107, 117, 124–126, 177, 178, 186, 189, 198, FOR 103, FOR 104, FOR 107–FOR 110, FOR 134, FOR 135, FOR 156, FOR 170, FOR 175; 326/93–98; 327/159, 45–49, 142, 156, 158, 162, 292; 331/57, 48, 55, DIG. 2; 324/76.19, 76.35, 76.54; 716/6, 10; 714/731, 744, 814, 815; 375/316, 375, 362, 372, 215, 327; 329/360

(56) References Cited

U.S. PATENT DOCUMENTS

| | | | |
|---|---|---|---|
| 5,799,049 | * 8/1998 | McFarland et al. | 375/362 |
| 5,815,016 | * 9/1998 | Erickson | 327/158 |
| 5,910,740 | * 6/1999 | Underwood | 375/375 |
| 5,920,216 | * 7/1999 | Fischer | 331/57 |
| 5,923,715 | * 7/1999 | Ono | 331/57 |
| 6,081,143 | * 6/2000 | Ho et al. | 327/46 |

* cited by examiner

*Primary Examiner*—Hal Wachsman
(74) *Attorney, Agent, or Firm*—Wagner, Murabito & Hao LLP

(57) ABSTRACT

A circuit for programmably generating a delay in a frequency monitor. In one embodiment, the circuit includes a delay cell. A delay cell controller is coupled to the delay cell. The delay cell controller is adapted to selectively control whether the delay cell is activated such that the frequency monitor can be programmably configured to have a selected delay associated therewith.

7 Claims, 6 Drawing Sheets

PROGRAMMABLE DELAY PATH CIRCUIT AND OPERATING POINT FREQUENCY DETECTION APPARATUS

TECHNICAL FIELD

The present claimed invention relates to the field of frequency monitors. More particularly, the present claimed invention relates to programmable frequency monitors.

BACKGROUND ART

Digital system components are typically implemented in an integrated circuit (IC) chip. Within the IC chip, the operation of an IC is regulated by a system clock, which is one of the fundamental components of a digital system (e.g., computer system). The system clock signal is generally a rectangular pulse train or square wave. In a synchronous digital system, the system clock determines the exact times at which an output can change states. Hence, the output of a digital system depends largely on the accuracy and integrity of the system clock.

The integrity of the output depends largely on whether the system clock signal is generated in an operable or non-operable frequency. A system clock signal that is generated at a non-operable frequency causes internal timing problems that will affect the integrity of the output. Typically, a low frequency monitor is used to ensure that the system clock signal does not fall below a minimum acceptable operating frequency. Conversely, a high frequency monitor is used to ensure that the system clock signal does not rise above a maximum acceptable operating frequency. By using a low frequency monitor and a high frequency monitor in combination, the system clock signal is monitored to ensure that the clock signal is being generated within a window of valid operating frequencies.

Conventional frequency monitor circuits are designed to monitor only a specific frequency. Therefore, a low frequency monitor designed to monitor, for example, a clock signal having an anticipated low frequency of 8 MHz could not be used in a processor or other part in which the low operating frequency is for example, 2 MHz. Similarly, a conventional high frequency monitor designed to monitor, for example, a clock signal having an anticipated high frequency of 16 MHz would not be well suited for use with a processor or other part in which the high operating frequency is substantially higher than 16 MHz. Therefore, often when using conventional frequency monitors, a separate frequency monitor must be designed for each respective high and low operating frequency of each processor or part being monitored. It will be understood that conventional frequency monitor circuits require extensive redesign to realize different frequencies. Thus, conventional frequency monitors are extremely inflexible, are functionally limited, and can add significant additional design and implementation costs.

As yet another drawback, actual operating characteristics of conventional frequency monitors can also vary from the expected or intended operating characteristics. For example, even when the frequency monitor is designed to monitor a specific known frequency, process variations, operating conditions, and the like may alter the actual performance of the frequency monitor. Hence, even a "properly" designed frequency monitor can deviate from its intended operating characteristics in such a manner as to render the frequency monitor unreliable or useless.

As still another drawback, conventional frequency monitors are not able to precisely determine the actual low or high operating frequency of a given processor or part. More specifically, conventional frequency monitors are designed only to monitor a specific frequency, and do not quantitatively provide information as the current high or low operating frequency of the clock signal being monitored.

Thus, a need exists for frequency monitor which is not limited to solely monitoring a specific frequency. A further need exists for a frequency monitor which can readily monitor a variety of clock signal frequencies associated with various processors or integrated circuit parts. Still another need exists for a frequency monitor which is still reliable and is useful even when subjected to process variations and various operating conditions. Also, a need exists for a frequency monitor which can be used to determine the current operating frequency of a clock signal being monitored.

DISCLOSURE OF THE INVENTION

The present invention provides a frequency monitor which is not limited to solely monitoring a specific frequency. The present invention further provides a frequency monitor which can readily monitor a variety of clock signal frequencies associated with various processors or integrated circuit parts. The present invention also provides a frequency monitor which is still reliable and is useful even when subjected to process variations and various operating conditions. Also, the present invention provides a frequency monitor which can be used to determine the current operating frequency of a clock signal being monitored.

More specifically, the present invention provides a programmable low frequency monitor. In one embodiment, the present invention is comprised of a programmable delay circuit disposed in a low frequency monitor. The programmable delay circuit is adapted to programmably generate a selected delay. As a result, the frequency monitor can be configured to monitor a variety of operating frequencies. In the present embodiment, the programmable delay circuit is comprised of at least one delay cell which can be selectively activated or deactivated. A delay cell controller is coupled to the delay cell. The delay cell controller is adapted to selectively control whether the delay cell is activated. In so doing, the present embodiment achieves a frequency monitor which is programmably configurable to realize a selected delay.

In another embodiment, the present invention provides a high frequency monitor which utilizes the programmable delay circuit.

In still another embodiment, the present invention provides a method for determining the maximum operating frequency for a component. In this embodiment, the present invention programmably generates a reference clock signal having a frequency associated therewith. The programmably generated reference clock signal is then compared with an operating frequency of a component. If the programmably generated reference clock signal and the operating frequency of the component meet selected criteria, the frequency of the programmably generated reference clock signal is incrementally increased. Next, the programmably generated reference clock signal having the incrementally increased frequency is compared with the operating frequency of the component. In this embodiment, these steps are repeated until the programmably generated reference clock signal and the operating frequency of the component no longer meet selected criteria.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

BEST MODE FOR CARRYING OUT THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The following disclosure contains a detailed description of both a programmable low frequency monitor and a programmable high frequency monitor. Both of the frequency monitors include a programmable delay circuit therein. The following discussion will begin with a detailed description of the programmable delay circuit. The following discussion will then describe, in detail, the function and operation of the both a programmable low frequency monitor and a programmable high frequency monitor wherein the monitors include the programmable delay circuit.

PROGRAMMABLE DELAY CIRCUIT

The present invention provides a programmable delay circuit or programmable delay path circuit which is implemented using selectively activated delay cells. The programmable delay path circuit of the present invention can be represented by a VHDL (Verilog Hardware Description Language) description wherein only a few constants (e.g., gate number) define the delay path circuit. These constants can be varied to readily recharacterize the programmable delay path circuit for porting it to different design technology environments and for realizing different frequencies within the same design technology environment. Hence, the programmable delay circuit of the present invention is readily suited to being used in conjunction with a variety of processors or parts. In one embodiment, the delay path circuit is fully programmable using programmable digital cell elements of a standard cell library and is used specifically within a reference clock generator circuit of a low frequency detector circuit or within a critical logic circuit of a high frequency detector circuit. Although the present invention programmable delay path circuit can be used within a variety of different designs, an exemplary delay path circuit is described below.

Figure 1:
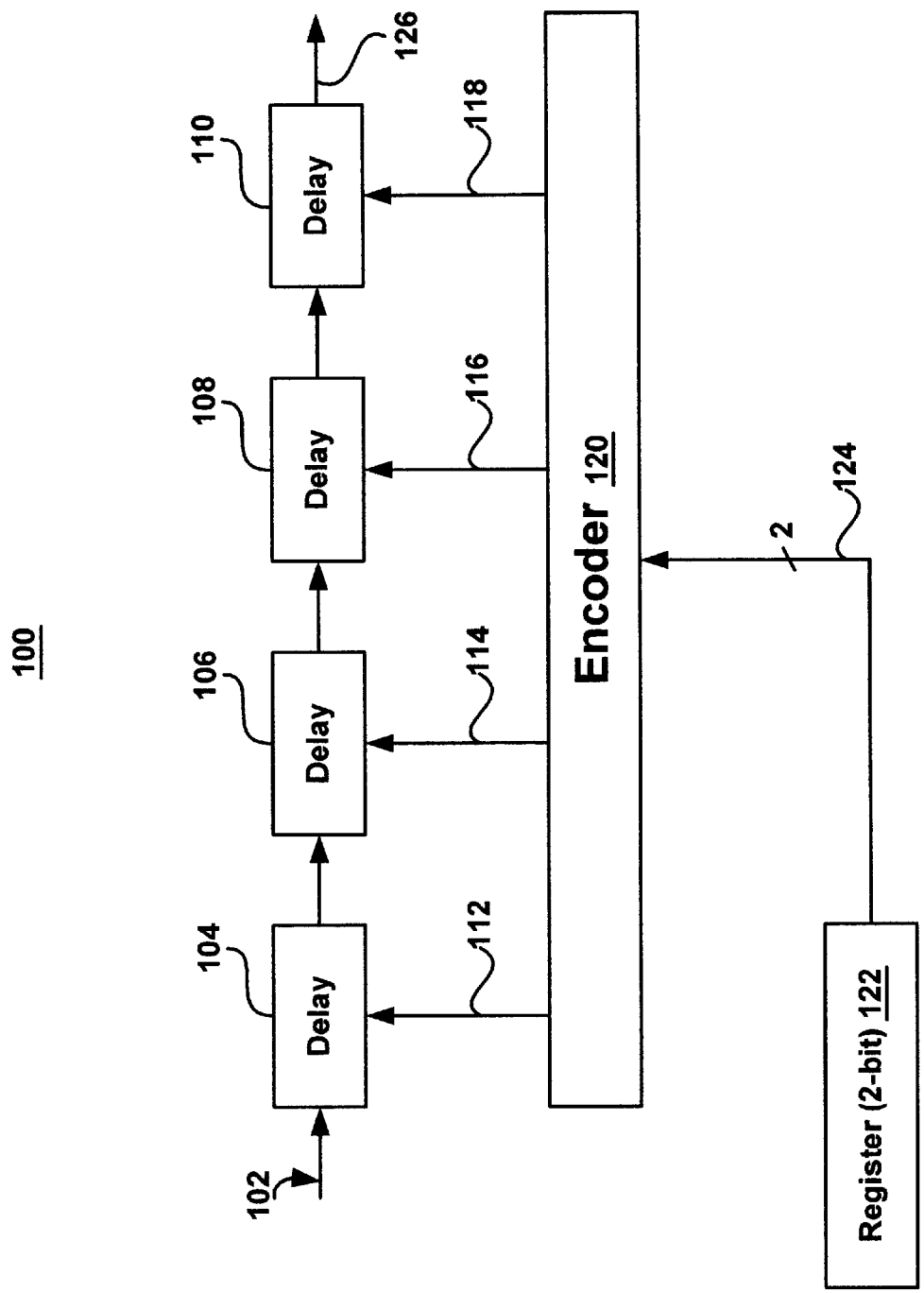
FIG. 1 is a block diagram of an exemplary programmable delay path circuit for generating an output clock signal of varying delays and frequencies in accordance with one embodiment of the present invention.

FIG. 1 is a block diagram of an exemplary programmable delay path circuit 100. Programmable delay path circuit 100 is adapted to generate an output clock signal of a desired frequency along line 126. The programmable delay path circuit 100 comprises delay cells 104, 106, 108, and 110. The programmable delay path circuit 100 may further include an encoder 120, and/or a register 122 for controlling the bypass inputs to the delay cells allowing the adjustment of the frequency that is monitored. The delay cells 104, 106, 108, and 110 are coupled in series. Each of the delay cells 104, 106, 108, and 110 is characterized by a delay time (hereinafter referred to as "delay"). The delay of a delay cell is defined as the time for a signal to traverse through the delay cell from the input to the output. When more than one delay cells are coupled in series, the delay times of each of the delay cells in the chain are added. For example, a signal may experience a delay of $t_p$ across a single delay cell and a delay of $2t_p$ across two delay cells where each delay cell is characterized by a delay of $t_p$.

Although each of the delay cells have the same delay in the present example, the present invention is well suited to an embodiment in which the delay cells not all have the same delay associated therewith. For example, in one "scalar-type" implementation, delay cell 104 would have a delay of $t_p^x$, delay cell 106 would have a delay of $t_p^{(x+1)}$, delay cell 108 would have a delay of $t_p^{(x+2)}$, and delay cell 110 would have a delay of $t_p^{(x+3)}$. For purposes of clarity, the following discussion pertains to an embodiment in which each of the delay cells has the same delay associated therewith. Delay cells 104, 106, 108, and 110 can be implemented by using inverters or inverter elements. Even though programmable delay path circuit 100 of the present invention is illustrated with four delay cells, the present invention is well suited to employing fewer or greater delay cells. As will be described in greater detail below, by implementing programmable delay path circuit 100 in a frequency monitor, the present invention achieves a frequency monitor which can be selectively programmed to monitor any one of various frequencies. That is, the frequency monitors of the present invention are not limited solely to monitoring a single specific frequency.

In programmable delay path circuit 100, a delay path can include any consecutive number of delay cells from the first delay cell 104. For example, if programmable delay path circuit 100 is comprised of N delay cells, a delay path may include only one delay cell, for the shortest delay path, or N delay cells (i.e., all delay cells), for the longest delay path. In general, when N delay cells are present, the delay path is comprised M delay cells, where M is an integer between zero and N.

With reference still to FIG. 1, delay cell 104 receives an input signal along signal line 102. Programmable delay path circuit 100 generates an output signal having a particular frequency at the output of delay cell 110 via signal line 126. The output frequency depends on the delay time of the individual delay cells and the number of activated delay cells in the delay path. It should be appreciated that the output signal can also be taken from the output of the last non-bypassed delay cell in a delay path. Delay cells 104, 106, 108, and 110 can be coupled to the encoder 120 to receive bypass signals along lines 112, 114, 116, and 118, respectively, from encoder 120. The bypass signals transmitted over lines 112, 114, 116, and 118 are used to selectively activate or bypass corresponding delay cells. In so doing, a delay path with having selected delay associated therewith is programmably created. As an example, if only a single bypass signal is transmitted over signal line 118 to delay cell 110, only delay cell 110 is bypassed. In such an instance, all other delay cells (104, 106, and 108), and their respective delays, comprise the delay path.

The register 122 contains data which indicates which delay cells are to be bypassed. That is, register 122 is used to programmably adjust the delay in programmable delay path circuit 100. In so doing, the frequency monitored by a frequency monitor containing programmable delay path circuit 100 is selectively adjusted. In one embodiment of the present invention, register 122 passes bypass signals directly to the individual delay cells. That is, such an embodiment does not include encoder 120. For example, in one configuration which does not include encoder 120, register 122 is comprised of 4 bits, one bit for each of delay cells 104, 106, 108, and 110. In the embodiment of FIG. 1, encoder 120 receives, from register 122, data indicating which delay cells to bypass. Encoder 120 encodes the data and generates the necessary bypass signals. For example, data of "01" in the register 122 can be interpreted by encoder 120 as an indication to generate bypass signals for delay cells 108 and 110. In the present example, a logical 0 signal received by a delay cell causes the cell to be bypassed. In such an example, delay cells 104 and 106 are not bypassed (i.e. delay cells 104 and 106 are active). An exemplary encoding scheme is illustrated in the following Table 1.

TABLE 1

| Register Data | Cell 104 Signal | Cell 106 Signal | Cell 108 Signal | Cell 110 Signal |
|---|---|---|---|---|
| 00 | 1 | 0 | 0 | 0 |
| 01 | 1 | 1 | 0 | 0 |
| 10 | 1 | 1 | 1 | 0 |
| 11 | 1 | 1 | 1 | 1 |

Although the present example specifically recites the encoding scheme shown in Table 1, those skilled in the art will appreciate that the present invention can also utilize various other encoding schemes.

Figure 2:
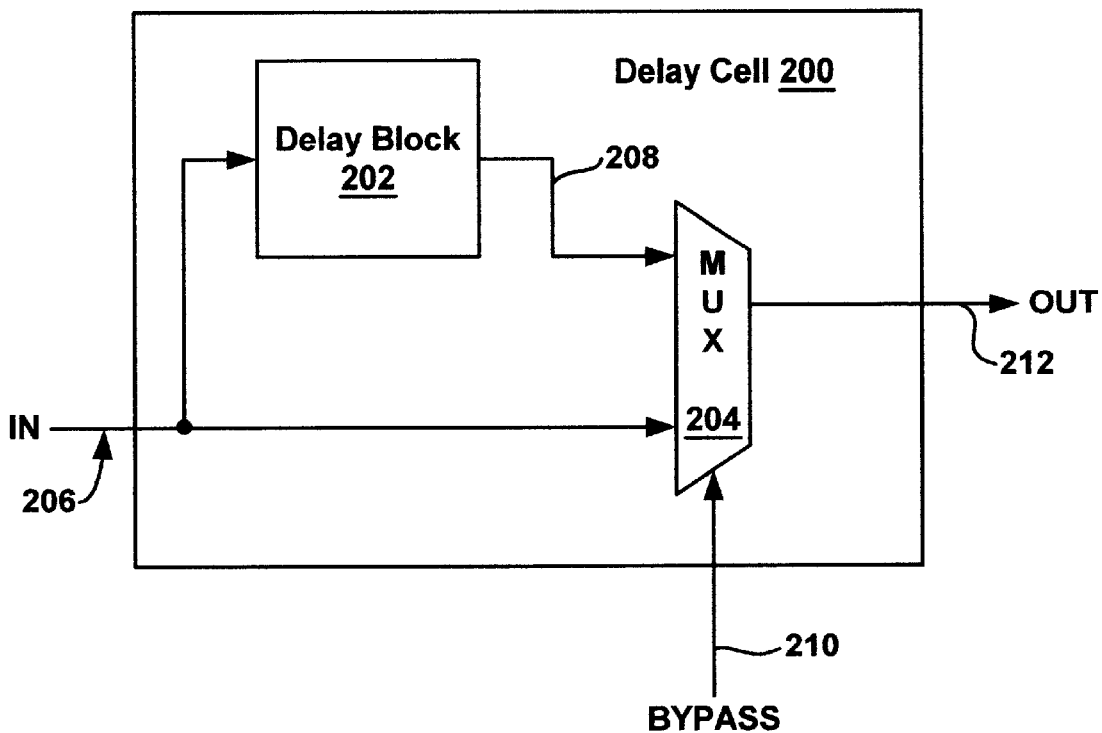
FIG. 2 is a schematic view of an exemplary delay cell which forms the basic element of the programmable delay path circuit of FIG. 1 in accordance with one embodiment of the present invention.

FIG. 2 illustrates an exemplary delay cell 200 which forms the basic element of the programmable delay path circuit 100. Delay cell 200 is comprised of a delay block 202 and a multiplexor 204. In operation, delay cell 200 receives an input signal IN along line 206, which is fed into both delay block 202 and multiplexor 204. Delay block 202 receives input signal IN and outputs a time delayed signal along line 208. The time delayed signal output along line 208 is then fed into multiplexor 204. Hence, multiplexor 204 receives an undelayed input signal IN and a time delayed signal as inputs. A bypass signal is fed into the multiplexor 204 along line 210 for selecting either the undelayed input signal IN or the delayed signal. In response to the bypass signal delivered along line 210, multiplexor 204 selects either the undelayed input signal IN or the time delayed signal. In this manner, delay cell 200 can either output, along line 212, an undelayed signal or a time delayed signal. Thus, in the present embodiment, when delay cell 200 is bypassed, delay cell 200 outputs the undelayed signal.

Programmable delay path circuit 100 of FIG. 1 can be programmed to generate an output signal by varying delay times. The delay times are changed by varying the number of delay cells in a delay path. Thus, programmable delay path circuit 100 can generate varying output frequency signals by incrementally adding or removing a delay cell from the delay path. For example, programmable delay path circuit 100 can generate one particular output frequency by bypassing all but first delay cell 104. Such a delay path (i.e. such a programmable delay path circuit configuration) generates the highest frequency output signal. Programmable delay path circuit 100 can add a second delay cell, for example, delay cell 106 in combination with first delay cell 104 to generate a lower frequency output, and so on. This process of enabling a delay cell in sequence generates output signals of progressively higher delay times and correspondingly lower frequencies.

Similarly, programmable delay path circuit 100 can be programmed to generate an output signal by incrementally reducing the number of delay cells activated (i.e. not bypassed) in the delay path. In such a configuration, the programmable delay path circuit 100 first generates an output signal using the longest delay path, which, in the embodiment of FIG. 1, includes all delay cells 104, 106, 108, and 110. The longest delay path generates the lowest frequency output signal due to the longest delay. Programmable delay path circuit 100 generates a higher frequency output signal by bypassing one delay cell such as delay cell 110, and so on. The process of reducing or disabling a delay cell in sequence generates output signals of progressively lower delay times and corresponding higher frequencies. This process can be used in the programmable low frequency detection apparatus described below to detect the low operating point frequency of an IC chip or a part thereof. The process of sequentially enabling or disabling the delay cells in a delay path can be stored as instructions in a memory unit and implemented through the use of a processor. The programmable delay path circuit 100, described in detail above in conjunction with FIG. 1 and FIG. 2, can be used in low and high frequency monitors, as described in the following sections.

LOW FREQUENCY MONITOR IMPLEMENTATION

Figure 3:
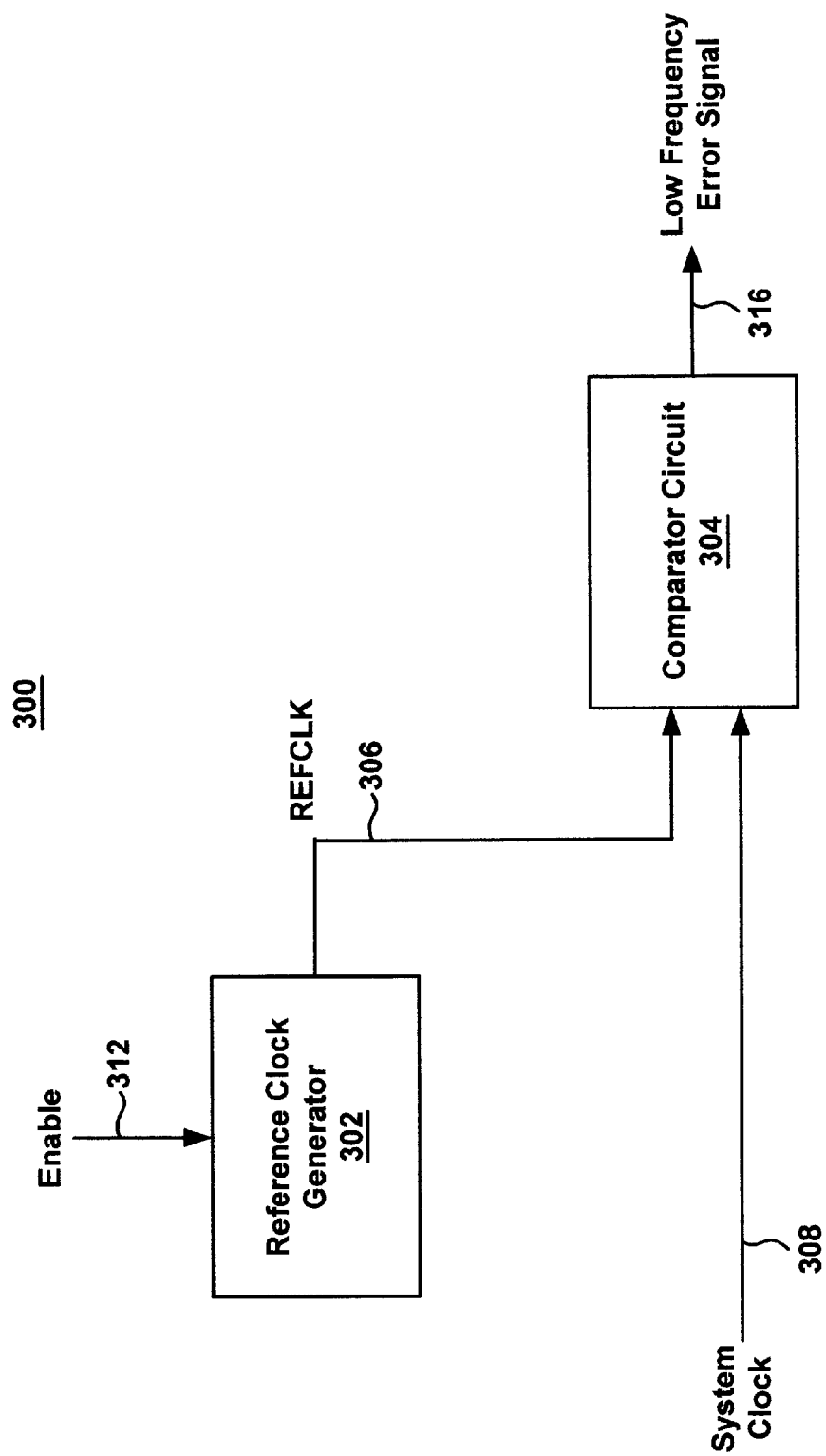
FIG. 3 illustrates a programmable low frequency detection circuit in accordance with one embodiment of the present invention.

FIG. 3 illustrates one embodiment of a programmable low frequency detection circuit 300 in accordance with the present claimed invention. Programmable low frequency detection circuit 300 is comprised of a reference clock generator 302 and a comparator circuit 304. Reference clock generator 302 generates a reference clock signal, REFCLK. The REFCLK signal is passed along line 306 to comparator circuit 304 as an input. The REFCLK signal is characterized by a frequency which is used as a reference low frequency. In the embodiment of FIG. 3, reference clock generator 302 receives an enable signal along signal line 312 and is activated when the enable signal is asserted (e.g., a logical one). In the present embodiment, the frequency of reference clock signal, REFCLK, is programmable using the programmable delay path circuit 100 of FIG. 1.

Referring still to FIG. 3, comparator circuit 304 also receives a system clock signal along line 308 as an input for comparison with the REFCLK signal. As will be understood by those of ordinary skill in the art, the system clock signal is used by various parts of an IC chip. Comparator circuit 304 compares the frequency of the REFCLK signal with the frequency of the system clock. When the system clock frequency is lower than the reference clock frequency, comparator circuit 304 generates a low frequency error detection signal along signal line 310. The low frequency error detection signal 310 indicates, for example, that generated data may be unreliable due to the unacceptably low operating frequency of the system clock.

Figure 4:
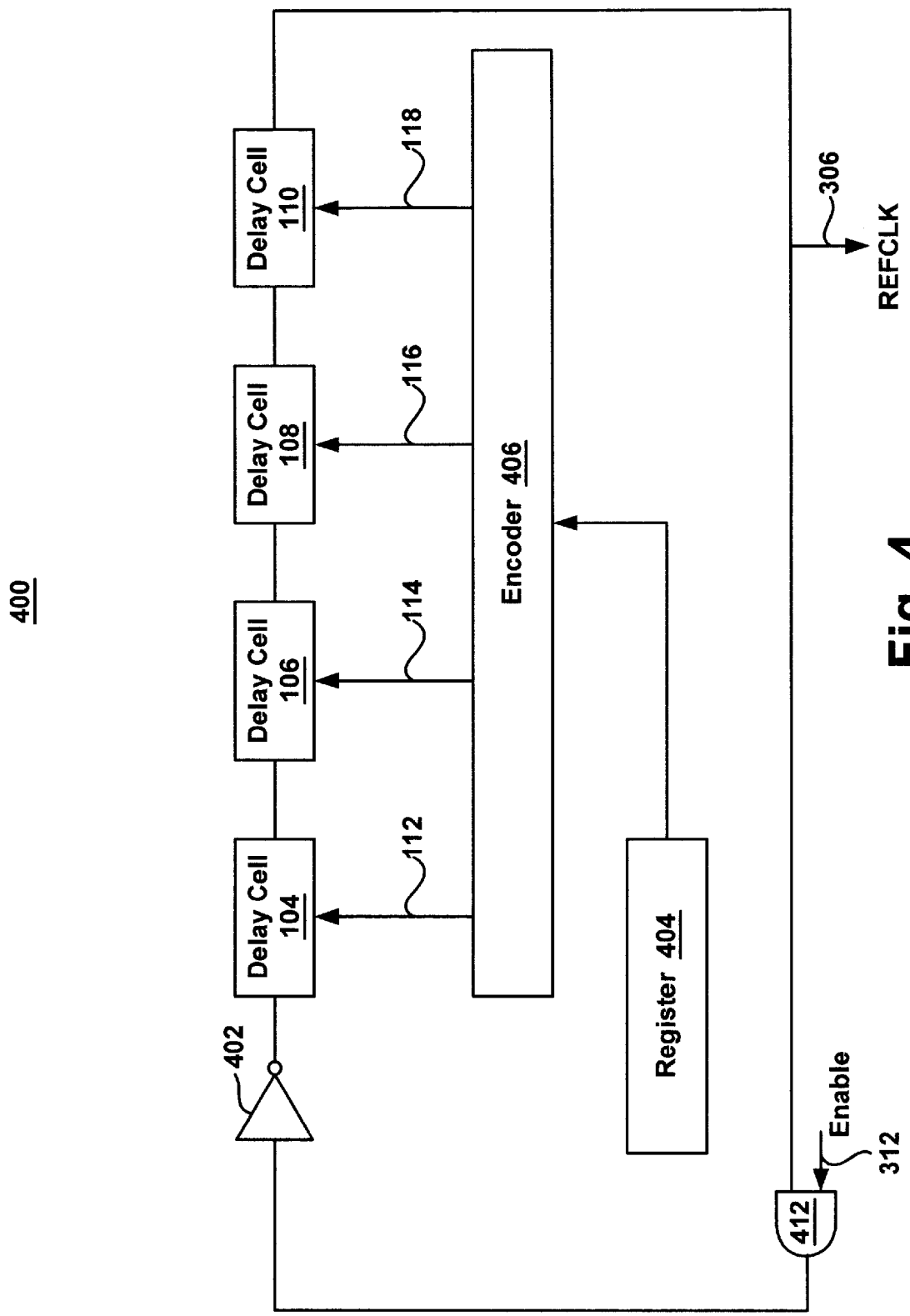
FIG. 4 is a block diagram of an exemplary programmable ring oscillator implementing a programmable delay path circuit for generating a reference clock of varying frequencies in accordance with one embodiment of the present invention.

Referring now to FIG. 4, in one embodiment of the present invention, the programmable low frequency detection circuit is configured as a ring oscillator to generate a reference clock signal, REFCLK, of varying frequencies. In such an embodiment, a programmable ring oscillator circuit 400 is formed by coupling in series at least one delay cell. Although five delay cells are shown in the embodiment of FIG. 4, it will be understood that various other numbers of delay cells could be selected. In the embodiment of FIG. 4, delay cells 402, 104, 106, 108, and 110 are coupled in a loop/ring configuration. Each of delay cells 402, 104, 106, 108, and 110 is characterized a delay time. In this embodiment, the delay times of delay cells 402, 104, 106, 108, and 110 are reasonably identical. Delay cells 104, 106, 108, and 110 receive bypass signals along signal lines 112, 114, 116, and 118, respectively, for selectively bypassing the delay cells to form a desired delay path. The process of selectively bypassing the delay cells is handled similarly to the process described in conjunction with the embodiment of FIG. 1.

Referring still to FIG. 4, delay cells can be implemented by using any of various elements that introduce delay. Such elements include, but are not limited to inverters, buffers (both inverting and non-inverting), transistors, and the like. Programmable ring oscillator circuit 400 of the present embodiment can also include an AND gate 412 for turning on and off the oscillation through an enable signal propagated along signal line 312. Although a specific implementation is illustrated in FIG. 4, the present invention is well suited to employing other gates and combinations in programmable ring oscillator circuit 400.

One of the main characteristics of a delay cell is its delay time, tp. The delay time of a delay cell is defined as the time for a signal to traverse through the delay cell from the input to the output. When more than one delay cells are coupled in series, the delay times of each of the delay cells in the chain are added. For example, a signal may experience a delay of tp across a single delay cell and a delay of 2tp across two delay cells where each delay cell is characterized by a delay of tp.

In general, an oscillator ring with N delay cells, including the first inverter, oscillates with a period of 2N*tp or with a frequency of 1/(2N*tp). Accordingly, because ring oscillator 200 of FIG. 2 includes five delay cells, it is characterized by a period of 10tp and a frequency of 1/(10tp). Furthermore, because frequency is inversely proportional to the number of delay cells, a ring oscillator with more delay cells generates a lower frequency clock signal than one with less number of delay cells. Conversely, a smaller number of delay cells leads to a higher frequency oscillation than a larger number of delay cells.

In accordance with the present invention, a ring oscillator having N delay cells can have N delay paths where N is an integer equal to or greater than 1. An Nth delay path is comprised of N delay cells. With reference to FIG. 4, ring oscillator circuit 400 includes 5 delay cells; hence, it can have 5 delay paths. Specifically, the five delay paths are: a first delay path including only delay cell 402; a second delay path including two delay cells 402 and, for example, delay cell 104; a third delay path including three delay cells; a fourth delay path including four delay cells; and a fifth delay path including five delay cells. The first delay path is the shortest and generates a reference clock signal, REFCLK, having the highest frequency of 1/(2tp). The longest delay path, on the other hand, includes all five delay cells and produces a reference clock signal, REFCLK, characterized by a frequency of 1/(10tp).

In one embodiment of ring oscillator circuit 400, first delay cell 402 of FIG. 4 is an inverter and is not programmable. This is because a ring oscillator typically must have at least one delay cell at all times to oscillate. Hence, in the embodiment of FIG. 4, first delay cell 402 always forms a part of the delay path. In an alternative embodiment, first delay cell is also programmable.

In the embodiment of FIG. 4, programmable ring oscillator circuit 400 is programmed in a manner as illustrated in programmable delay path circuit 100 of FIG. 1. That is, programmable ring oscillator circuit 400 further includes an encoder 406, and/or a register 404 for controlling the bypass inputs to delay cells 104, 106, 108, and 110, thereby allowing adjustment of the low frequency that is monitored. Although the resultant reference clock signal is shown as being output on signal line 306, it should be appreciated that reference clock signal can also be taken from the output of last delay cell in a delay path.

HIGH FREQUENCY MONITOR IMPLEMENTATION

Figure 5:
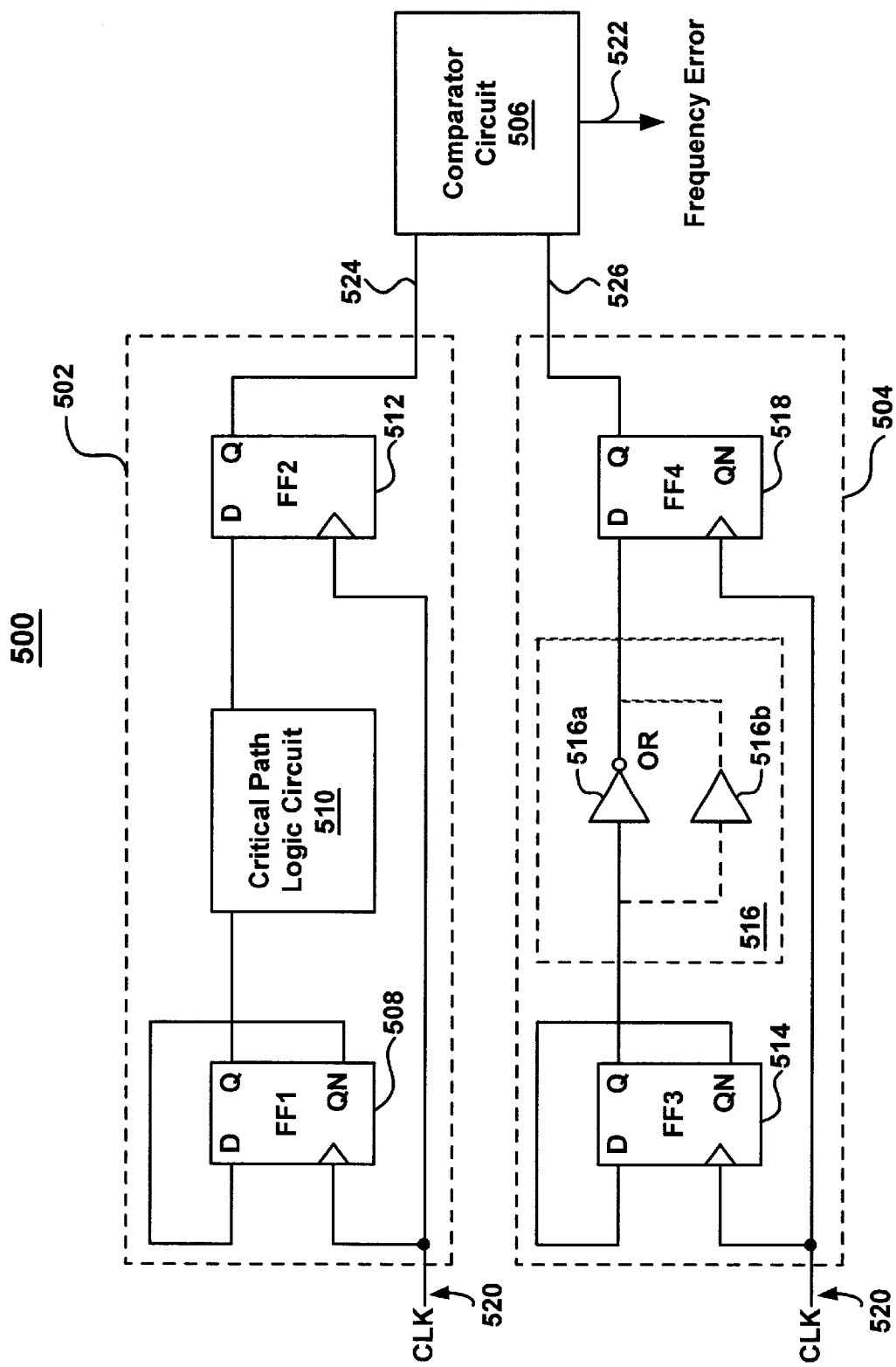
FIG. 5 is a block diagram of an exemplary programmable high frequency detection circuit in accordance with one embodiment of the present invention.

With reference now to FIG. 5, The present invention also provides a programmable high frequency detection circuit which is well suited for use in an IC device. FIG. 5 illustrates a block diagram of an exemplary programmable high frequency detection circuit 500 in accordance with an embodiment of the present invention. Programmable high frequency detection circuit 500 comprises a programmable critical path generation circuit 502, a known path generation circuit 504, and a comparator circuit 506. Programmable high frequency detection circuit 500 compares the output of programmable critical path generation circuit 502 with that of a known path generation circuit 504. If the output signal transmitted along line 524 is not the same as the output signal transmitted along line 526, an error signal may be generated and output along line 522. In this embodiment, comparator circuit 506 can be configured to only output an error signal upon the occurrence of more than one mismatch between the signals on lines 524 and 526, upon significant variations between the signals on lines 524 and 526, or upon various other conditions which a programmer deems worthy of generating the error signal.

Programmable high frequency detection circuit 500 can be programmed to generate a selected delay path having a respective delay. In so doing, the present embodiment readily determines a critical delay path or critical path. The critical path refers to the longest delay path between any pair of registers that will allow an IC or a part thereof to operate in a known state and still obtain predictable results. Programmable critical path generation circuit 502 is comprised of a pair of registers 508 and 512 and a programmable critical path logic circuit 510. Programmable critical path logic circuit 510 is coupled between the pair of registers, 508 and 512. In this embodiment, programmable critical path logic circuit 510 introduces a delay between registers 508 and 512. More specifically, critical path logic circuit 510 is comprised of the programmable delay path circuit 100 of FIG. 1 whose structure and operation is described in detail above. Thus, the delay introduced between registers 508 and 512 by critical path logic circuit 510 can be varied by selectively programming programmable delay path circuit 100.

In the present embodiment, programmable high frequency detection circuit 500 includes a first register 508 which is implemented using a flip-flop. First register 508 is configured to receive a clock signal, CLK, via signal line 520. In so doing, data may be latched into the first register 508 during transitions of CLK. Tile output, Q, of the first register 508 is coupled to an input of the critical path logic circuit 510. An inverse output QN of first register 508 is fed back to an input D of first register 508.

With reference still to FIG. 5, the output of the critical path logic circuit 510 is fed to the input D of second register 512. Second register 512 is also coupled to the clock signal, CLK, via signal line 520, so that data may be latched into second register 512 during transitions of the clock signal, CLK. In this embodiment, second register 512 is used to implement an extra delay (i.e., at least the hold time of the second register 512 flip-flop) so that the results of the second register 512 flip-flop will be reliable at the frequency of interest.

The embodiment of FIG. 5, as mentioned above, also includes known path generation circuit 504. In order not to generate a high frequency error signal, the known path generation circuit 504 must have a delay which is shorter than the delay of programmable critical path generation circuit 502. In the present embodiment, known path generation circuit 504 comprises a logic buffer 516 coupled between two registers 514 and 518. In this configuration, register 514 is implemented using a flip flop. Register 514 flip flop is coupled to the clock signal, CLK, on signal line 520, so that data may be latched into register 514 synchronously during transitions of the clock signal, CLK. The output Q of register 514 is coupled to an input of the logic buffer 516. An inverse output QN of register 514 is fed back to an input D of register 514. In this embodiment, register 518 is also a flip-flop. The output of logic buffer 516 is fed to the input D of register 518. Register 518 is also coupled to clock signal CLK, so that data may be latched into register 518 during transitions of CLK in a synchronous manner.

In the present embodiment, logic buffer 516 generates a delay which is intended to be much shorter than the delay of the programmable critical path generation circuit 502. In accordance with one embodiment of the present invention, the logic buffer 516 is an inverting buffer 516A having an input coupled to the output Q of register 514 and an output coupled to the input D of register 518. In an alternative embodiment, logic buffer 516 is a non-inverting buffer 516B having an input coupled to the output Q of register 514 and an output coupled to the input D of register 518. In the present embodiment, the use of an inverting buffer 516A or a non-inverting buffer 516B is based on whether programmable critical path logic circuit 510 is inverting or non-inverting.

With reference still to FIG. 5, the output signal from programmable critical path generation circuit 502 and the output signal 526 of the known path generation circuit 504 are then provided to comparator circuit 506. Comparator circuit 506 compares the received signals. If the two signals are the same, no error is detected. However, if the two signals are different, then an error is detected. The result of the comparison is then recorded by a counting mechanism within comparator circuit 506. After a predetermined number of mismatches (i.e., one or more depending on the desire of the user), comparator circuit 506 will generate a frequency error signal which is output on signal line 522. In this embodiment, the counter mechanism of comparator circuit 506 is used to ensure that programmable high frequency detection circuit 500 is not continuously causing errors in the IC or any part thereof. Hence, by changing/programming the number of delay cells in the delay path of critical path logic circuit 510 (i.e., programmable delay path circuit 100), programmable high frequency detection circuit 500 can change the frequency that is monitored.

The present invention is also well suited to utilizing the present programmable high frequency detection circuit 500 to determine the high operating point frequency of an IC or a part thereof. For example, consider an example in which the speed of a processor is being tested using an embodiment of FIG. 5, which includes in critical path logic circuit 510, containing programmable logic circuit 100. In such an embodiment, delay cells in the delay path are sequentially enabled to gradually increase the delay path. In this method, the testing of an IC or a part thereof starts by enabling the first delay cell (e.g. delay cell 104 of FIG. 1). If an error signal is generated by comparator circuit 506, the processor is said to operate at a maximum frequency of 25 MHz. If no error signal is generated by comparator circuit 506, a second delay cell 106 is enabled. If an error signal is then generated by comparator circuit 506, the processor is said to operate at a maximum frequency of 50 MHz. If no error signal is generated by comparator circuit 506, a third delay cell 108 is enabled. If an error signal is then generated by comparator circuit 506, the processor is said to operate at a maximum frequency of 75 MHz. If no error signal is generated by comparator circuit 506, a fourth delay cell 110 is enabled. If an error signal is generated by comparator circuit 506, the processor is said to operate at a maximum frequency of 100 MHz. Thus, the maximum operating frequency for an IC or a part thereof can be effectively determined. Although a specific example is recited above, such precise numbers are recited for purposes of illustration and clarity. It will be understood that the actual number of delay cells and the frequencies corresponding thereto used to determine maximum operating parameters of an IC or a part thereof will vary depending upon numerous factors.

Figure 6:
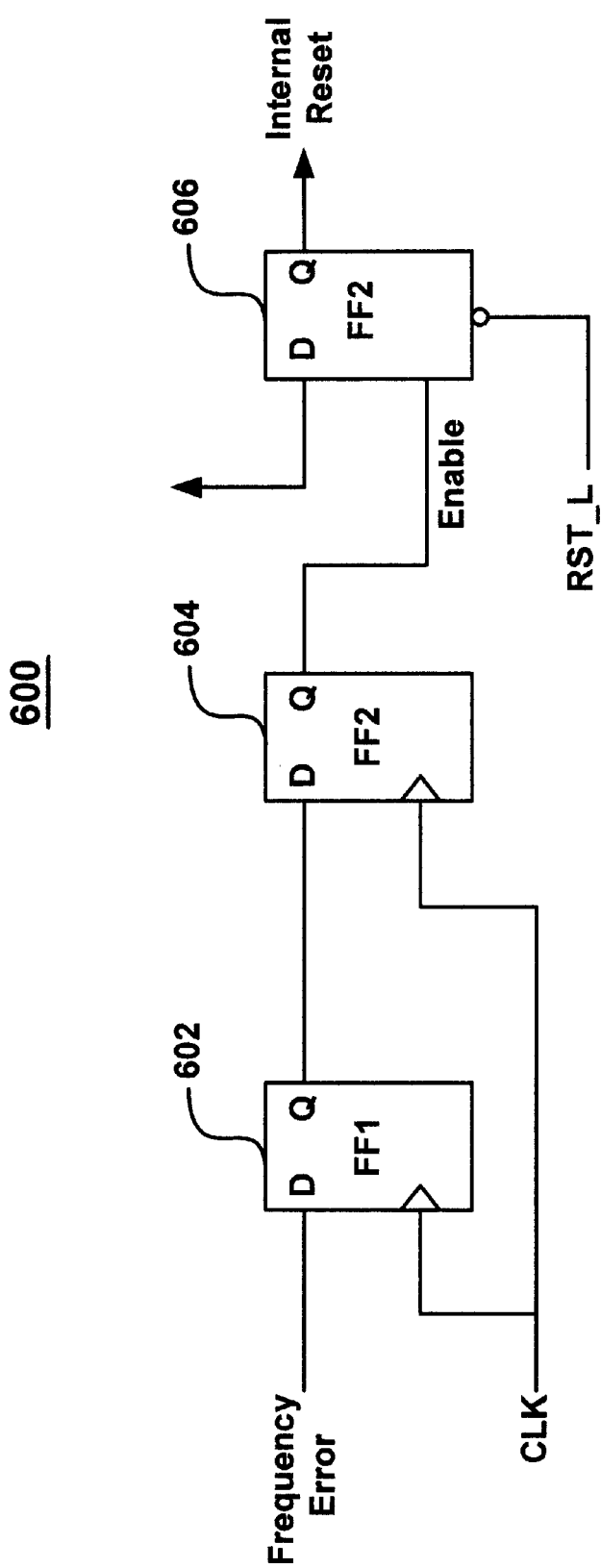
FIG. 6 illustrates a frequency protection circuit that can be used in conjunction with either the programmable low frequency detection circuit or the programmable high frequency detection circuit in accordance with one embodiment of the present invention.

After programmable low frequency detection circuit 300 and high frequency detection circuit 500 detect low and high frequencies, respectively, the present invention provides for the protection of the detected low and high frequencies. FIG. 6 illustrates a frequency protection circuit 600 that can be used in conjunction with either the programmable low frequency detection circuit 300 or the programmable high frequency detection circuit 500. The programmable low frequency detection circuit 300 outputs low frequency error signal while the programmable high frequency detection circuit 500 outputs a high frequency error signal. For purposes of describing the frequency protection circuit 600, the programmable low frequency detection circuit 300 and the programmable high frequency detection circuit 500 are referred collectively as a frequency detection circuit and the error signals generated at their outputs are referred collectively as a frequency error signal.

With reference to FIG. 6, the frequency error signal generated by the frequency detection apparatus is provided to the frequency protection circuit 600. The frequency protection circuit 600 has an input coupled to an output of the frequency detection apparatus and an output coupled to an IC chip for sending a signal to disable the IC chip when an error signal is generated. In accordance with one embodiment of the present invention, the frequency protection circuit 600 is comprised of a first flip-flop 602 having a first input I) coupled to the output of the frequency detection apparatus and a second input coupled to the clock signal, CLK, for receiving the frequency error signal outputted by the frequency detection circuit. A second flip-flop 604 is also provided and has a first input D coupled to an output Q of first flip-flop 602 and a second input coupled to the clock signal CLK. Second flip-flop 604 is used for decoupling the frequency error signal to ensure that there are no meta-stable events. A third flip-flop 606 is further provided and has an enable input coupled to an output Q of second flip flop 604. The third flip flop 606 is used for sending an internal reset signal to disable an IC chip and for continuing to disable the IC chip until a reset signal RST_L is sent to the third flip-flop 606 to reset and clear the third flip-flop 606. Hence, if an IC chip is running at a lower or higher frequency than is acceptable, frequency protection circuit 600 will disable the IC chip or a portion thereof until flip-flop 606 is reset. In this manner, the present invention protects the detected/monitored frequencies.

Thus, the present invention provides a frequency monitor which is not limited to solely monitoring a specific frequency. The present invention further provides a frequency monitor which can readily monitor a variety of clock signal frequencies associated with various processors or integrated circuit parts. The present invention also provides a frequency monitor which is still reliable and is useful even when subjected to process variations and various operating conditions. Also, the present invention provides a frequency monitor which can be used to determine the current operating frequency of a clock signal being monitored.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the claims appended hereto and their equivalents.

What is claimed is:

1. A programmable frequency monitor circuit comprising:
   a programmable reference clock generator adapted to programmably generate a reference clock signal having a first frequency, said programmable reference clock generator comprising:
   a delay path circuit comprising delay cells coupled in series, each of said delay cells having a respective delay time associated therewith; and
   a delay cell controller coupled to each of said delay cells, said delay cell controller adapted to selectively activate a delay cell such that said programmable frequency monitor circuit can be programmably configured to have a selected delay associated therewith, wherein said selected delay is the sum of delay times associated with activated delay cells and wherein said selected delay is used for establishing said first frequency;
   a comparator coupled to said programmable reference clock generator and adapted to receive a system clock signal and said reference clock signal, wherein said system clock signal has a second frequency, said comparator further adapted to compare said system clock signal with said reference clock signal and generate an error signal when said second frequency of said system clock signal is different than said first frequency of said reference clock signal; and
   a frequency protection circuit coupled to said comparator and adapted to disable an integrated circuit when said error signal is generated;
   whereby said programmable frequency monitor circuit provides high and low frequency monitoring for integrated circuits having different system clock signal frequencies.

2. The programmable frequency monitor circuit as recited in claim 1 wherein said delay cells are coupled in series in a ring oscillator configuration.

3. The programmable frequency monitor circuit as recited in claim 1 further comprising:
   a delay cell selector coupled to said delay cell controller, said delay cell selector adapted to selectively activate a delay cell based upon information received from said delay cell controller.

4. The programmable frequency monitor circuit as recited in claim 1 wherein each of said delay cells comprises:
   a delay element coupled to receive an input signal and generate a delayed output signal; and
   a multiplexor coupled to receive said input signal, said delayed output signal, and a selection signal, said multiplexor for outputting either said input signal or said delayed output signal in response to said selection signal received by said multiplexor.

5. The programmable frequency monitor circuit as recited in claim 1 wherein said error signal is generated when said second frequency is lower than said first frequency.

6. The programmable frequency monitor circuit as recited in claim 1 wherein said error signal is generated when said second frequency is higher than said first frequency.

7. The programmable frequency monitor circuit as recited in claim 6 wherein said comparator generates said error signal when said second frequency is higher than said first frequency a predetermined number of times.

* * * * *